United States Patent [19]

Plumton et al.

[11] Patent Number: 4,843,033

[45] Date of Patent: Jun. 27, 1989

[54] METHOD FOR OUTDIFFUSION OF ZINC INTO III-V SUBSTRATES USING ZINC TUNGSTEN SILICIDE AS DOPANT SOURCE

[75] Inventors: Donald L. Plumton, Dallas, Tex.; Shiban K. Tiku, Camarillo, Calif.

[73] Assignee: Texas Instruments Incorporated, Dallas, Tex.

[21] Appl. No.: 40,425

[22] Filed: Apr. 20, 1987

Related U.S. Application Data

[63] Continuation-in-part of Ser. No. 781,280, Sep. 27, 1985, abandoned.

[51] Int. Cl.$^4$ .................. H01L 21/24; H01L 21/225
[52] U.S. Cl. .................. 437/161; 437/160; 437/162; 437/178; 437/184; 437/200; 437/32; 437/39; 437/45; 437/911; 437/173; 148/DIG. 19; 148/DIG. 56; 148/DIG. 123; 148/DIG. 147; 357/22; 357/35; 357/67
[58] Field of Search .................. 437/167, 142, 98, 97, 437/76, 44, 45, 160, 161, 178, 174, 82, 31, 32, 41, 200, 184, 173, 911; 148/DIG. 19, DIG. 56, DIG. 123, DIG. 147; 357/22, 35, 67

[56] References Cited

U.S. PATENT DOCUMENTS

| | | | |
|---|---|---|---|
| 3,863,334 | 2/1975 | Coleman | 29/590 |
| 4,339,869 | 7/1982 | Reihl et al. | 29/576 B |
| 4,450,620 | 5/1984 | Fuls et al. | 29/571 |
| 4,452,646 | 6/1985 | Zuleeg | 148/1.5 |
| 4,495,512 | 1/1985 | Isaac et al. | 357/34 |
| 4,531,282 | 7/1985 | Sakai et al. | 437/44 |
| 4,586,968 | 5/1986 | Coello-Vera | 148/188 |
| 4,593,457 | 6/1986 | Birrittella | 29/576 B |
| 4,692,348 | 9/1987 | Rubloff et al. | 437/82 |

FOREIGN PATENT DOCUMENTS

| | | | |
|---|---|---|---|
| 0065664 | 5/1977 | Japan | 437/161 |
| 0013879 | 8/1980 | Japan | |
| 0018971 | 1/1985 | Japan | 437/160 |

OTHER PUBLICATIONS

Inoue, S. et al, *IEEE IEDM*, Dec. 8-10, 1980, pp. 152-155.
Tiku, S. K., *Electronics Letters*, vol. 21, No. 23, Nov. 7, 1985, pp. 1091-1093.
Zuleeg, R. et al, *IEEE Transactions on Electron Devices*, vol. ED-25, No. 6, Jun. 1978, pp., 628-639.
Troeger, G. L. et al, *IEEE IEDM*, 1979, pp. 497-500.
Yuan, H. T., IEEE GaAs IC Symposium, 1982, pp. 100-103.
Zuleeg, R. et al, IEEE Electron Device Letters, vol. EDL-5, No. 1, Jan. 1984, pp. 21-23.
Kato, Y. et al, IEEE GaAs IE Symposium, 1982, pp. 187-190.
Tiwari, S., *IEEE IEDM Technical Digest*, 1986, pp. 262-265.
Shih, K. K., *J. Electrochemical Society*, vol. 123, No. 11, Nov. 1976, pp. 1737-1740.

*Primary Examiner*—Brian E. Hearn
*Assistant Examiner*—T. N. Quach
*Attorney, Agent, or Firm*—Ferdinand M. Romano; Carlton H. Hoel; Mel Sharp

[57] ABSTRACT

A method of diffusion of dopants (e.g. zinc) into III-V substrates (e.g. GaAs) using metal silicide and dopants (e.g. $W_xSi_y$:Zn) is disclosed. A cap layer (e.g. SiO$_2$ or Si$_3$N$_4$) is also used. The zinc tungsten silicide is formed by cosputtering zinc and tungsten silicide (W$_5$Si$_3$). Applications include adjustment of threshold voltages in JFETs by rapid thermal pulsing of zinc into device channel regions and use of the zinc tungsten silicide as a base contact plus extrinsic base dopant source together with a nitride sidewall self-alignment.

17 Claims, 18 Drawing Sheets

Deposit and pattern gates

Deposit source and drain
Drive-in Zn to adjust Vt

Implant and anneal channels
and source drain regions  *Fig. 2a*

Deposit and pattern gates

Deposit silicon nitride
pulse anneal to form p+  *Fig. 2c*

Deposit source and drain
Drive-in Zn to adjust Vt

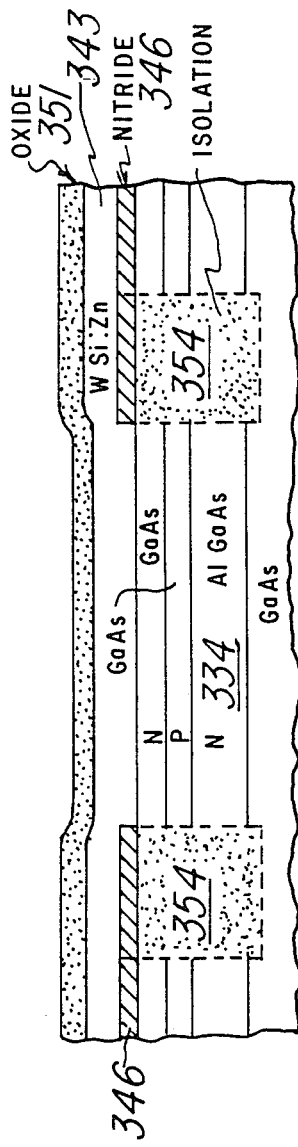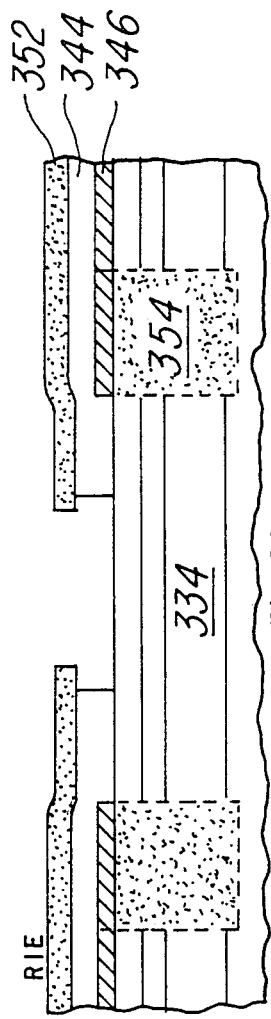
Fig.9a
Fig.9b

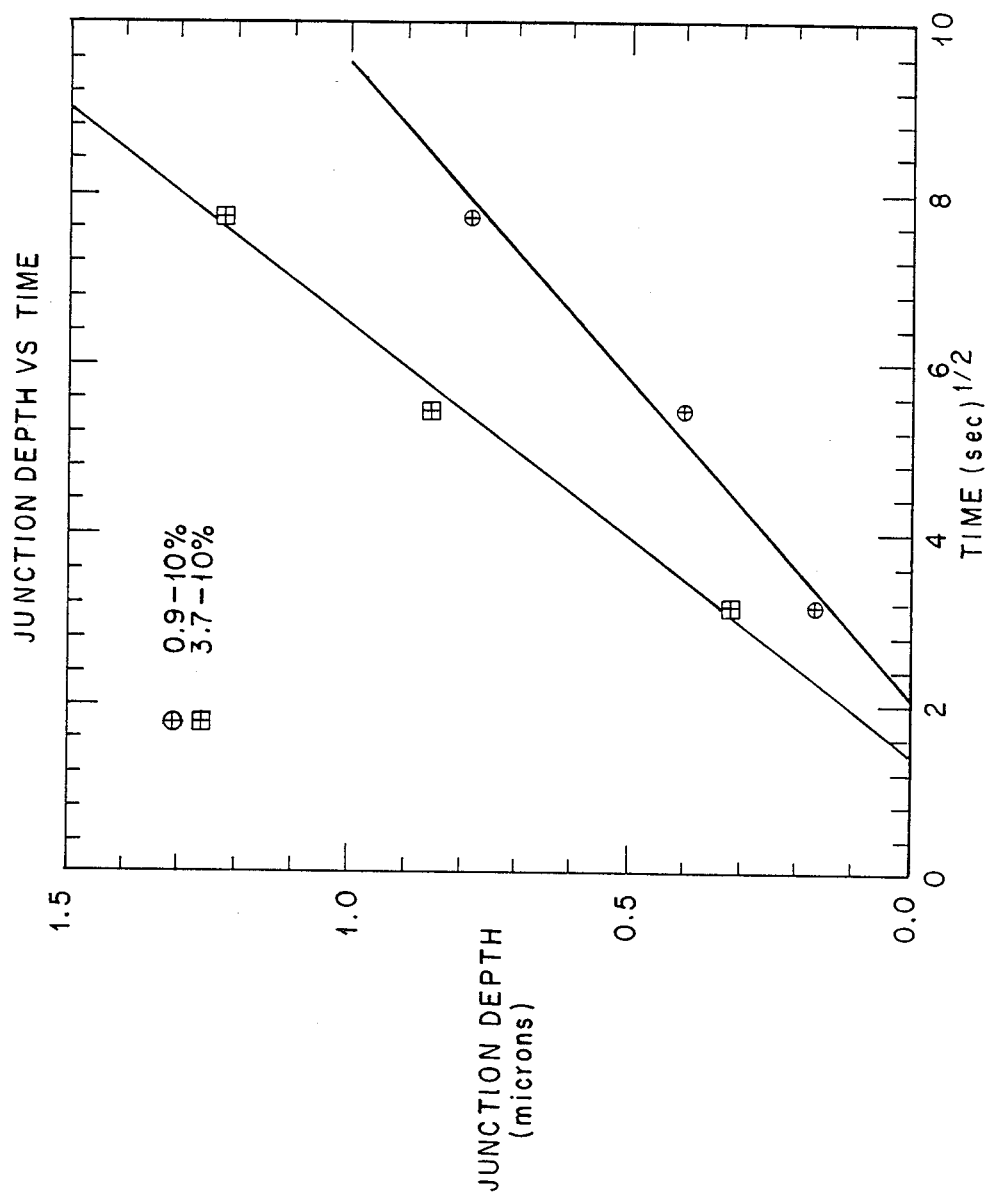

METHOD FOR OUTDIFFUSION OF ZINC INTO III-V SUBSTRATES USING ZINC TUNGSTEN SILICIDE AS DOPANT SOURCE

CROSS-REFERENCE TO RELATED APPLICATIONS

This application is a continuation-in-part of copending U.S. application Ser. No. 781,280, filed Sept. 27, 1985 now abandoned. This cross-referenced application is assigned to the assignee of this application.

BACKGROUND OF THE INVENTION

1. Field of the Invention

The present invention relates to semiconductor electronic devices, and, more particularly, to formation of self-aligned doped regions in gallium arsenide and related devices.

2. Description of the Related Art.

Gallium arsenide has emerged as a leading contender for high speed integrated circuits because of its high electron mobility. Further, it is available in semi-insulating form and most gallium arsenide device technologies are expected to have better radiation hardness for total dose ionizing radiation than silicon. The gallium arsenide junction field effect transistor (JFET) in particular is expected to have higher hardness for single event upset when used in complementary integrated circuit design. The direct coupled FET logic (DCFL) based on enhancement/depletion technology has emerged as the major candidate for low power, high speed integrated circuit applications. But the enhancement mode (normally-off) MESFET fabricated by the recessed gate process needs severe process control due to the threshold voltage adjustment by wet or dry etching and suffers from a yield loss problem because of the recess etch. In the planar process, enhancement mode MESFET (whether self-aligned or not) threshold voltage cannot be adjusted after the channel regions are formed; thus the threshold voltage must be controlled by carefully screening the starting material and improving the reproducibility of the ion-implantation and annealing steps.

In contrast, JFET processes offer more fabrication flexibility without any loss of device performance and with the advantage of larger logic swing in integrated circuits. In known JFET processes (see, for example, Y. Kato et al, High Speed and Low Power GaAs JFET Technology, 1982 GaAs IC Symposium, 187–190) the p+ junction gate regions are formed by selective diffusion using a gaseous diffusion source or other solid sources that must be subsequently stripped off. Thus micron sized gates cannot be fabricated as the gate metal has to be realigned to the p+ region. The same reasoning applies to ion-implanted junctions; see R. Zuleeg et al, Double Implanted GaAs Complementary JFETs, 5 IEEE Elec.Dev.Lett. 21 (1984). This realignment problem also requires the source and drain be placed far from the gate to allow for alignment tolerances and thus introduces series resistances. Also, the threshold voltage cannot be adjusted after the fabrication is complete because the ohmic contacts degrade under high temperature treatment. And thus the known JFET processes have the problems of unavailability of micron sized gates and lack of threshold voltage adjustment.

Bipolar aluminum gallium arsenide heterojunction transistors, especially as used in heterojunction I²L devices (see, H. Yuan, GaAs Bipolar Gate Array Technology, 1982 GaAs IC Symposium 100), are limited in speed by device size. Typical processes use implants such as Be to form p+ regions which then have gold-zinc ohmic contacts applied, but this requires alignment of the contact after the implant and limits size reduction. It is a problem to achieve self-aligned contacts in gallium arsenide and other III-V devices.

SUMMARY OF THE INVENTION

The present invention provides a silicide metallization for gallium arsenide and other III-V compounds that acts as its own source of diffusing dopants to yield self-aligned contacts to doped regions. Also, high temperature stable ohmic contacts are provided which are used with the metallization to provide adjustment diffusions. And a sidewall self-alignment process is also provided which may be used with the metallization to provide base-emitter structure in bipolar transistors. In preferred embodiments this permits threshold voltage adjustment by additional drive-in diffusion when the metallization is used as a JFET gate and the high temperature ohmic contact as source and drain contacts, and also permits small area emitter or collector when the doping from the metallization is used to form the extrinsic base in bipolar heterojunction transistors with the sidewall self-alignment for the emitter or collector in inverted transistors. The preferred embodiments include zinc tungsten silicide applied on gallium arsenide. The preferred embodiment ohmic contacts include non-eutectic gold:germanium, and the preferred embodiment sidewall self-alignment includes silicon nitride/silicon dioxide depositions on gallium arsenide.

Thus the problems of alignment and high temperature ohmic contact degradation are solved by the invention.

BRIEF DESCRIPTION OF THE DRAWINGS

FIGS. 2A–D illustrate the first preferred embodiment method of fabrication of the device of FIG. 1;

FIGS. 9A–E illustrate the fourth preferred embodiment method of fabrication of the device of FIG. 8;

FIGS. 11–18 illustrate the flexibility of the fabrication methods.

DESCRIPTION OF THE PREFERRED EMBODIMENTS

Figure 1A:
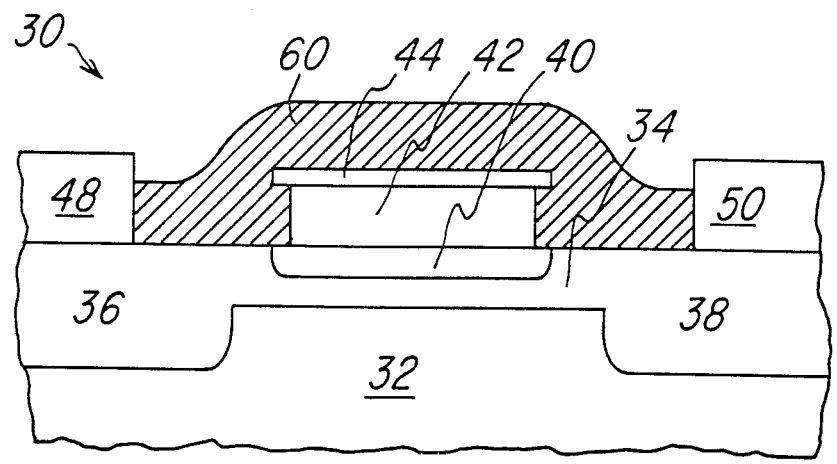
FIGS. 1A–B are schematic cross sectional elevation and plan views of a first preferred embodiment JFET.
Figure 1B:
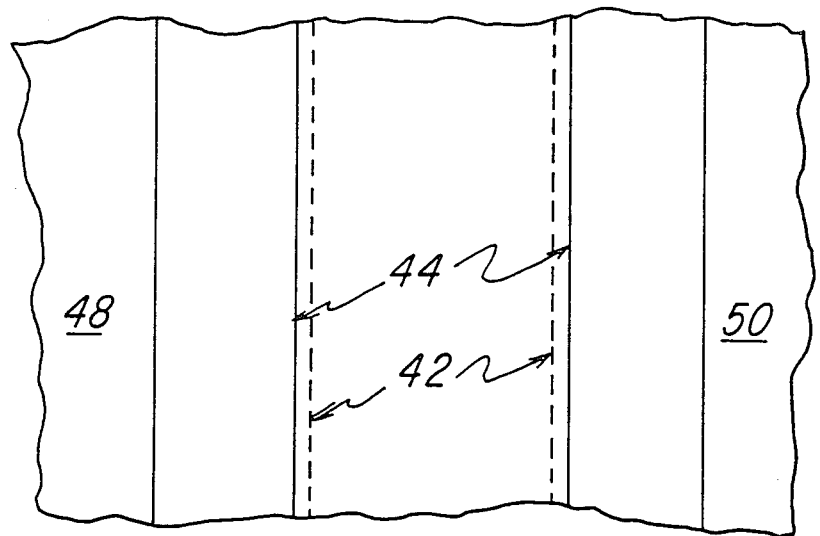

A first preferred embodiment device, a junction field effect transistor (JFET) generally denoted 30 in the drawings, is shown in schematic cross sectional elevation and plan views in FIGS 1A-B and includes semi-insulating single crystal gallium arsenide substrate 32, n type channel layer 34 in substrate 32 and about 2,500 Å thick, n+ type source region 36, n+ type drain region 38, p+ type junction gate 40 about 1,000 Å deep and one micron long in layer 34, tungsten silicide zinc gate 42 on junction gate 40, nickel contact layer 44 on gate 42, source ohmic contact 48, drain ohmic contact 50, and silicon nitride insulator 60. The width of gate 42 and junction gate 40 is typically several microns. JFET 30 typically would be part of an integrated circuit containing various devices such as other JFETs, bipolar transistors, MESFETs, diodes, thin film resistors, and reactances.

The characteristics of JFET 30 are best described by consideration of the steps of first preferred embodiment method of fabrication of JFET 30 which are illustrated in schematic cross sectional views in FIGS. 2A-D and include the following:

(a) A semi-insulating gallium arsenide substrate 32 has photoresist spun on and patterned to define the channel 34 plus source 36 and drain 38; then a dose of $3 \times 10^{12}$ silicon atoms/cm$^2$ is implanted at 60 keV using the patterned photoresist as a mask. This forms the n type channel 34 plus n type regions for the source and drain. Next photoresist is again spun on and patterned to define just source 36 and drain 38, and a dose of $3 \times 10^{13}$ silicon atoms/cm$^2$ at 175 keV is implanted to increase the source 36 and drain 38 doping to n+. The implantations are followed by an anneal at 850° C.; see FIG. 2A.

(b) Gate metallization is deposited by cosputtering zinc and tungsten silicide (W$_5$Si$_3$) with the first 500 Å composed of about 10% zinc and the remaining 1,000 Å with no zinc. Then 100 Å of nickel is deposited on the silicide. Photoresist is spun onto the nickel and patterned to define nickel layer 44; then the photoresist is used as a mask for plasma etching the nickel and zinc tungsten silicide with CF$_4$+O$_2$. Note that only the bottom portion of the zinc tungsten silicide contains zinc to make the plasma etching easier, and that some zinc residue is left by the plasma etching which may be stripped with a dilute HCl dip. Also, the nickel 44 resists the plasma etch well, but the zinc tungsten silicide does erode to leave nickel 44 overhanging gate 42. See FIG. 2B.

(c) A silicon nitride cap layer 60 is deposited by plasma enhanced CVD to a thickness of 800 Å, and a rapid thermal anneal pulse at 600° C. for thirty seconds diffuses zinc out of gate 42 into channel 34 to form junction gate 40. Note that the duration of the thermal pulse depends upon the doping profile of channel 34, and that further thermal pulse drive-in will be used later to adjust the threshold voltage of JFET 30. See FIG. 2C.

(d) Photoresist is spun on and patterned to define source and drain contacts, and silicon nitride 60 etched using the patterned photoresist as a mask. The patterned photoresist is left on and 100 Å of nickel, 1,000 Å of gold:germanium (75%: 25% by weight), 200 Å of nickel, and 1,500 Å of gold are deposited. The photoresist is dissolved in acetone to lift off the metals except for a source contact and a drain contact. The metals are alloyed at 550° C. for about 10 seconds; this yields source contact 48 and drain contact 50 which have a contact resistance in the order of $10^{-6}$ Ω-cm$^2$. Note that the nickel leads to better and stable ohmic contacts; and that contact alloys with below about 20% germanium by weight will puddle and be rendered ineffective during the threshold adjustment thermal pulses. The threshold voltage of device 30 can now be probed using these contacts and adjusted by successive further thermal pulses at 550° C. typically of a few seconds duration. See FIG. 2D. Note that the non-eutectic gold:germanium alloy is stable through these threshold adjusting pulses; whereas, the usual eutectic alloy cannot tolerate over 450° C.

Figure 3:
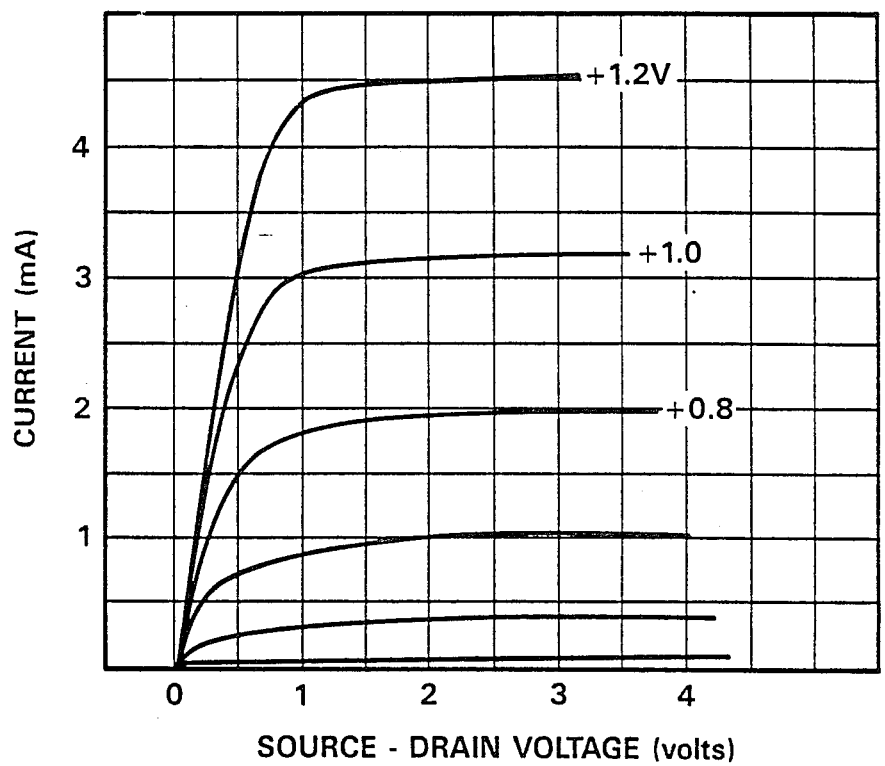
FIGS. 3 and 4 illustrate characteristics of the device and fabrication method of FIGS. 1 and 2.

FIG. 3 shows the typical current-voltage characteristics of an enhancement mode JFET 30 with a forty micron wide gate. The effective gate length is estimated to be about 1.4 microns. The device has a high saturation current and a transconductance of 175 mS/mm and a low on resistance of about 100 Ω. Subthreshold currents were measured to be about 0.3 μA/μm of gate width at the threshold voltage and are thus lower than those of MESFETs.

Figure 4:
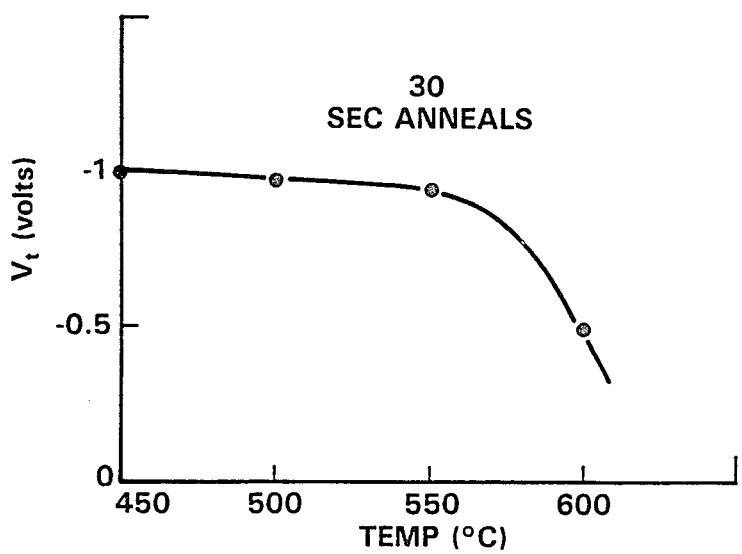

FIG. 4 illustrates the change of threshold voltage as a function of the threshold adjustment annealing temperature for a fixed thermal anneal pulse of 30 seconds. The rapid thermal annealing was performed in an A. G. Assoc. Heatpulse 210. To adjust the threshold voltage in a reasonably short time a temperature of about 550° should be used; above 550° C. the change is too quick as indicated by FIG. 4. The sharpness of junction gate 40 in channel 34 and the stability of the threshold voltage at high temperatures are both functions of the zinc concentration in the gate metallization and can be optimized to give both good device characteristics and stability. In fact, at 200° C. the predicted time for a drift of 0.1 volt in the threshold voltage is more than 100,000 hours.

Figure 5A:
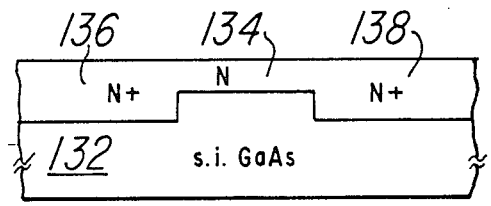
FIGS. 5A–E scematcially illustrate the second preferred embodiment method of fabrication of and a cross sectional elevation view of a second preferred embodiment device.
Figure 5B:
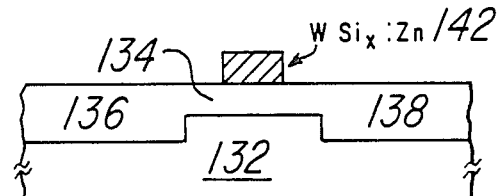
Figure 5C:
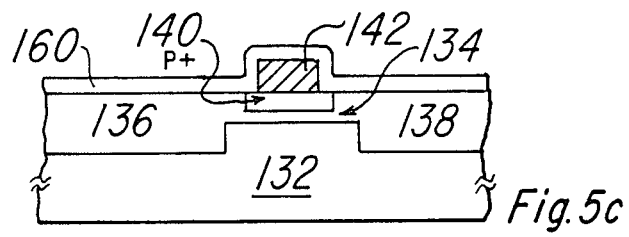
Figure 5D:
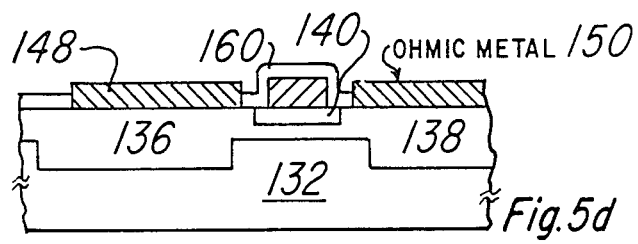
Figure 5E:
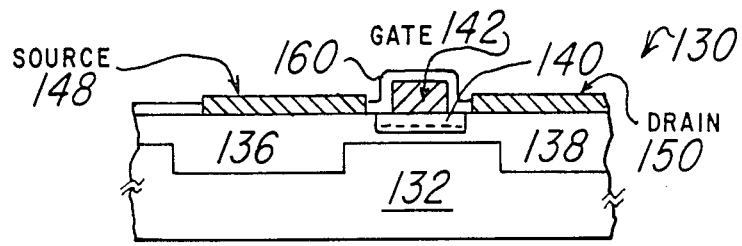

FIGS. 5A-E illustrate in schematic cross sectional elevation views the steps in fabricating a second preferred embodiment JFET 130 which differs from JFET 30 by omission of nickel layer 44. Thus, briefly, FIG. 5A shows implantation to form n type channel 134 and n+ source 136 and drain 138 in semi-insulating gallium arsenide substrate 132. FIG. 5B indicates the deposition and patterning of zinc tungsten silicide gate; and FIG. 5C shows the deposition of silicon nitirde 160 and the thermal pulse to diffuse the zinc out of gate 142 into channel 134 to form p+ type junction gate 140. FIG. 5D illustrates the patterning of nitride 160 and the deposition of high temperature ohmic metallization for source contact 148 and drain contact 150. Lastly, FIG. 5E indicates the drive-in (from dotted line to solid line) of zinc to adjust the threshold voltage.

Figure 6A:
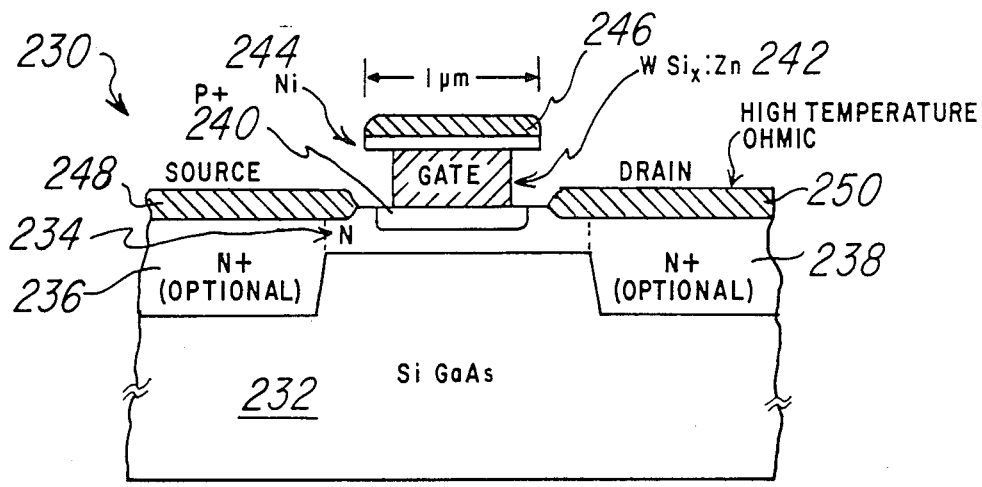
FIGS. 6A–B are schematic cross sectional and plan views of a third preferred embodiment device.
Figure 6B:
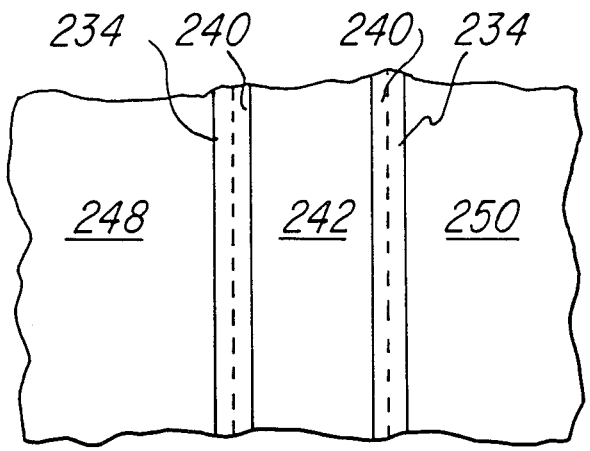

Third preferred embodiment JFET, generally denoted 230, has self-aligned source and drain contacts was well as the junction gate self-aligned with the metal gate. In particular, FIGS. 6A-B are schematic cross sectional elevation and plan views of JFET 230 which includes semi-insulating single crystal gallium arsenide substrate 232, n type channel layer 234 in substrate 232 and about 2,000 Å thick, n+ type source region 236, n+ type drain region 238, p+ type junction gate 240 about 1,000 Å deep and one micron long in layer 234, tungsten silicide zinc gate 242 on junction gate 240, nickel contact layer 244 on gate 242, gate ohmic contact 246, source ohmic contact 248, and drain ohmic contact 250. The width of gate 242 and junction gate 240 is typically several microns. The self-aligned feature of source contact 248 and drain contact 250 is best understood in connection with the third preferred embodiment method of fabrication which includes the following steps as illustrated in FIGS. 7A-D.

Figure 2B:
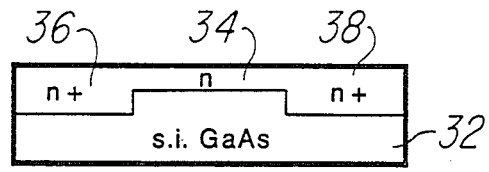
Figure 2B:
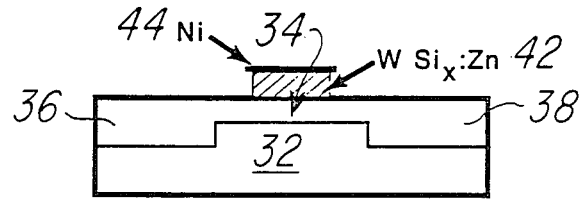
Figure 2D:
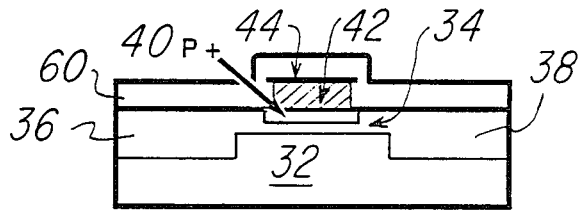
Figure 2D:
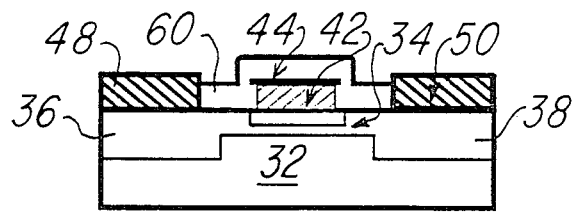
Figure 7A:
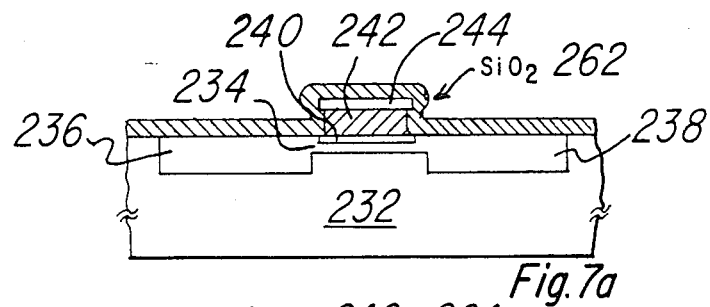
FIGS. 7A–D illustrate the third preferred embodiment method of fabrication of the device of FIG. 6.

(a) First substrate 232 is implanted and annealed to form channel 234 and source 236 and drain 238 in the same manner as substrate 32; see FIG. 2A. Next, zinc tungsten silicide gate metal and nickel are deposited and patterned to yield gate 242 and nickel layer 244 again as with substrate 32; see FIG. 2B. Then a silicon nitride cap is deposited and a rapid thermal pulse anneal drives zinc from gate 242 into channel 234 to form p+ junction gate 240 as with substrate 32; see FIG. 2C. Then the silicon nitride cap is stripped and silicon dioxide 262 is deposited by plasma enhanced CVD; this yields a "breadloaf" shaped deposit as illustrated in FIG. 7A. Note that the overhang of nickel layer 244 on gate 242 enhances the breadloafing.

Figure 7B:
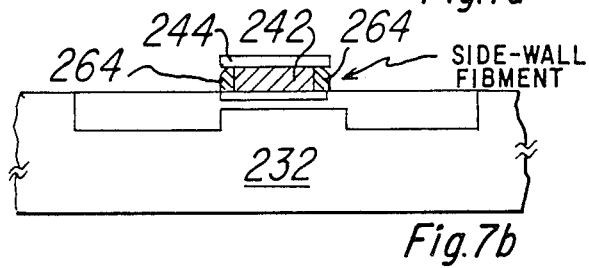

(b) Reactive ion etching with $CF_4$ anisotropically removes all of dioxide 262 except for the gate sidewall filaments 264 protected by the overhang of nickel layer 244; see FIG. 7B.

Figure 7C:
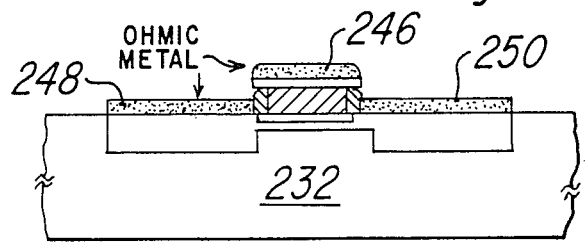
Figure 7D:
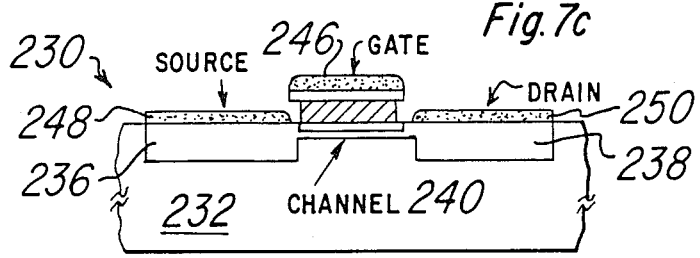

(c) Ohmic metal is sputter deposited to form gate contact 246, source contact 248, and drain contact 250; see FIG. 7C. Note that the separation between source contact 248 and gate 242 is the thickness of the oxide sidewall filament 264 which is equal to the overhang of nickel 244 on gate 242. Of course, this is also the separation betrween drain contact 250 and gate 242. If the ohmic metal is to be the same gold:germanium of JFET 30, then the deposition would proceed as previously described and would be followed by a 550° C. alloying anneal for ten seconds.

(d) Oxide sidewall filaments 262 are stripped to yield JFET 230. Contact wires, passivation layers, packaging, and so forth have been omitted for clarity as they were in the other embodiments. Also, with the high temperature non-eutectic gold:germanium contacts in place JFET 230 may be probed and the threshold voltage adjusted as previously described.

The separation between source contact 248 and gate 242 will typically be about 3,000 Å, and thus the overall source to drain distance may be about 2 to 3 microns which is much less than the known JFETs which have 7 or more micron source to drain overall distance.

JFETs 30, 130, and 230 and their methods of fabrication have the features of (i) the doping levels well above background effects of commercially available gallium arsenide material, (ii) the active channel is below the surface of the gallium arsenide where various phenomena give rise to uniformity and reproducibility problems, (iii) rapid thermal annealing can be used for implant activation as the silicon implant is high dose and deep, (iv) self-alignment and small oversize by use of the gate as a source of dopants and by use of the sidewall filaments, (v) the gate barrier height of a JFET (typically 1.4 eV) is much larger than that of a MESFET (0.8 eV), thus allowing larger logic voltage swings, (vi) the threshold voltage can be adjusted and thereby increase yield, and (vii) the methods can be extended to complementary logic circuits which cannot be fabricated with MESFETs.

Figure 8A:
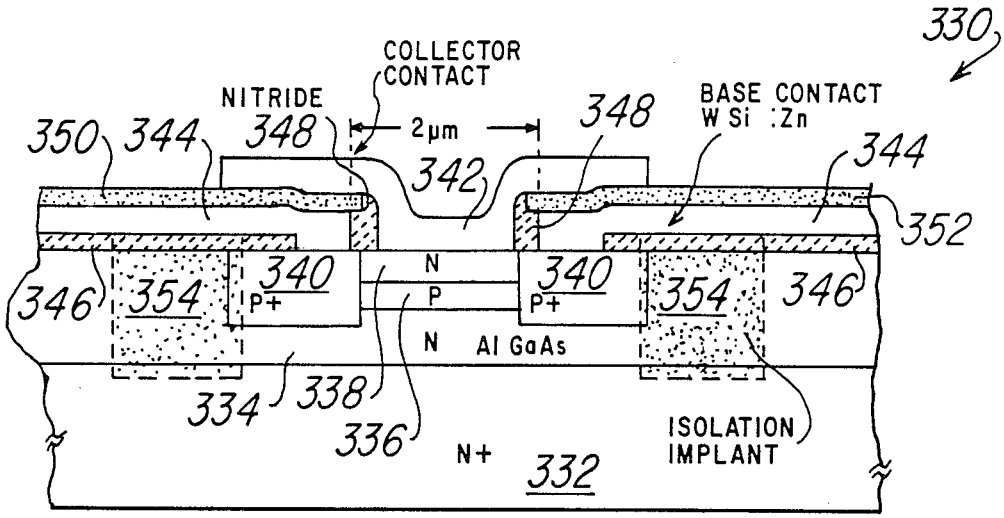
FIGS. 8A–B are schematic cross sectional and plan views of a fourth preferred embodiment device.
Figure 8B:
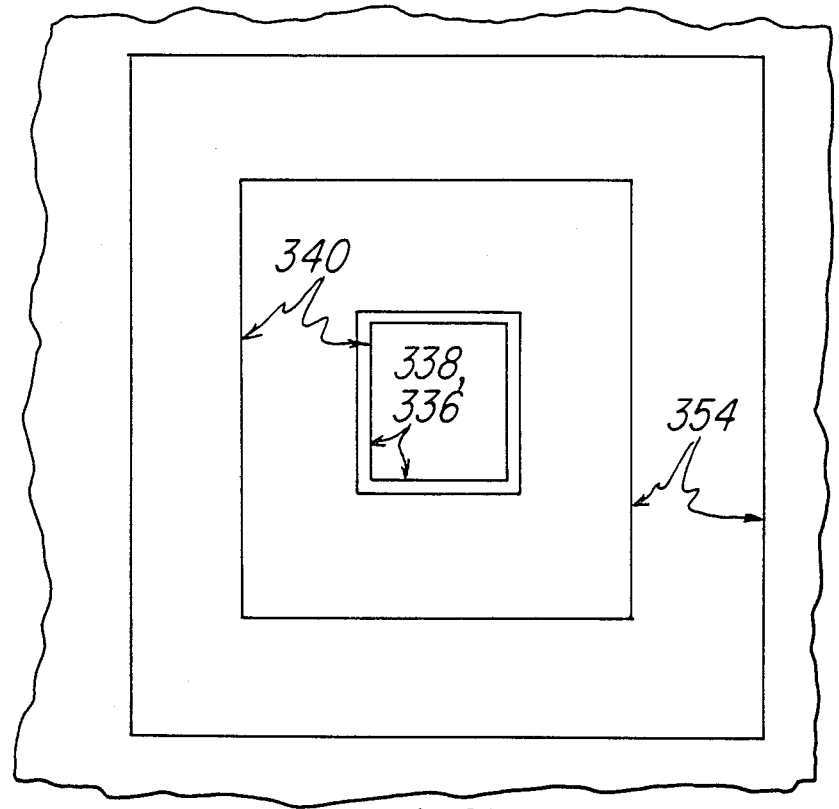
Figure 9C:
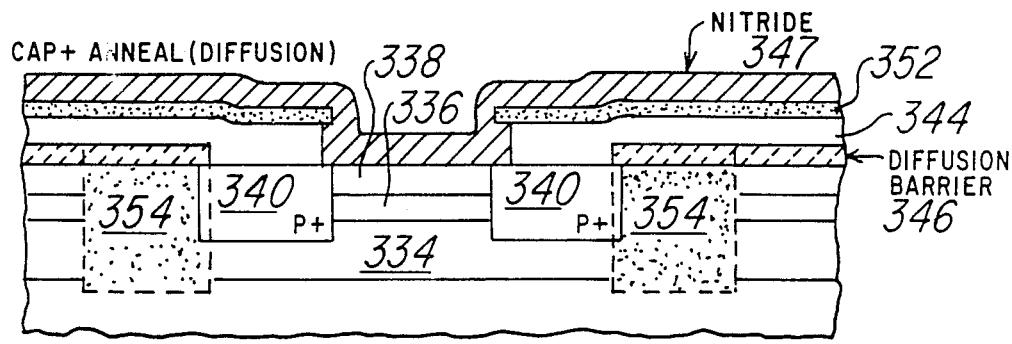

Fourth preferred embodiment bipolar transistor, generally denoted 330 and shown in schematic cross sectional elevation and plan views in FIGS. 8A-B, includes n+ GaAs substrate 332, n $Al_xGa_{1-x}As$ emitter 334, p GaAs base 336, n GaAs collector 338, p+ extrinsic base 340, collector contact 342, zinc tungsten silicide base contact 344, silicon nitride insulator 346, silicon nitride sidewall isolation 348, silicon dioxide insulator 352, and device isolation 354. The plan view of FIG. 8B illustrates the annular shape of region 340 which is about five microns square with a two micron square hole. Device 330 is an inverted heterojunction bipolar n-p-n transistor with a grounded emitter (substrate 332); this arrangement is useful in integrated injection logic (I²L). Of course, 338 could be the emitter and 334 the collector. Further explanation of device 330 and its characteristics are best made in conjunction with a description of the fourth preferred embodiment method of fabrication which includes the following steps:

(a) Begin with a single-crystal layered substrate with the following layers in order from the surface: 3,000 Å thick n GaAs, 2,000 Å thick GaAs, 8,000 Å thick n $Al_xGa_{1-x}As$ at least 2 microns thick n+GaAs; such a layered substrate may be grown by MBE or MOCVD. Spin on photoresist and pattern it to define the isolation region 354 which is annular with a five micron hole in an eight micron square; see FIG. 8B. The photoresist is then used as a mask for implantation of protons to form isolation region 354. The photoresist is removed and 1,000 Å of silicon nitride is deposited and patterned to form isolation layer 346. Next 3,000 Å of zinc tungsten silicide 343 is deposited by cosputtering zinc and tungsten silicide, and 2,000 Å of silicon dioxide 351 is deposited by PECVD; see FIG. 9A.

(b) Photoresist is spun on and patterned to define the hole in annular region 340, and the photoresist used as a mask for plasma etching of oxide 351 and silicide 343 in $CF_4+O_2$. This forms oxide isolation 352 and zinc tungsten silicide basebcontact 344; note that the silicide etches faster than the oxide and an overhang forms. See FIG. 9B.

(c) 3,000 Å of nitride 347 is deposited conformally, and a rapid thermal anneal at 700° C. for thirty seconds diffuses zinc out of silicide 344 and forms p+ extrinsic base 340. Note that extrinsic base 340 includes portions of the GaAs layers and the $Al_xGa_{1-x}As$ layer; the strong doping makes the layer distinction irrelevant in extrinsic base 340 and thus the layer indications have been dropped therein in the Figures. Also, this diffusion defines base 336 and collector 338. Observe that nitride 346 is a barrier to zinc diffusion from silicide 344 into regions other than extrinsic base 340. See FIG. 9C.

Figure 9D:
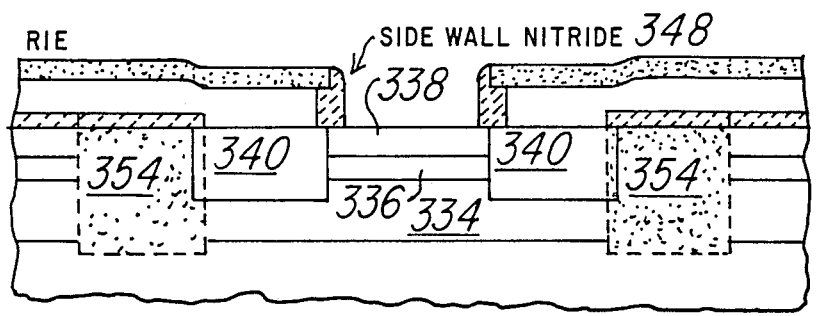

(d) A further 3,000 Å of nitride are deposited and the nitride anisotropically etched by RIE to leave sidewall nitride 348. Note that the overhang of the oxide 352 helps form this sidewall nitride by protecting it from direct ion bombardment. See FIG. 9D.

Figure 9E:
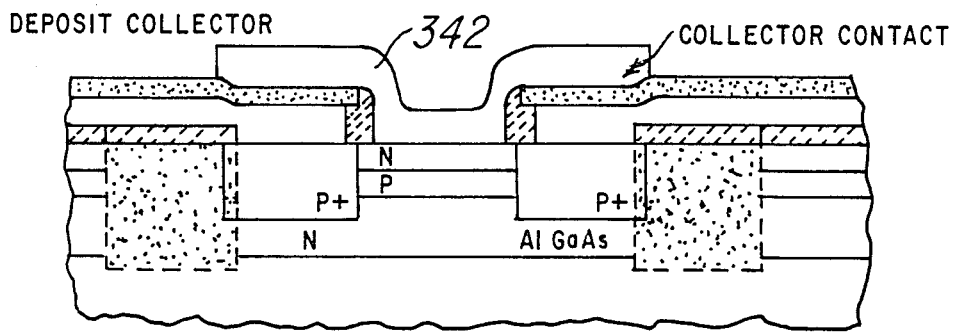

(e) Photoresist is spun on and patterned to define the collector contact. Collector contact metal (e.g.,gold:germanium) is deposited by lift-off and alloyed to form collector contact 342, and device 330 is complete (note that items such as leads have been omitted for clarity). See FIG. 9E, and note that the collector contact is larger than the via through which it makes contact with collector 338, thus alignment problems are avoided.

Figure 10:
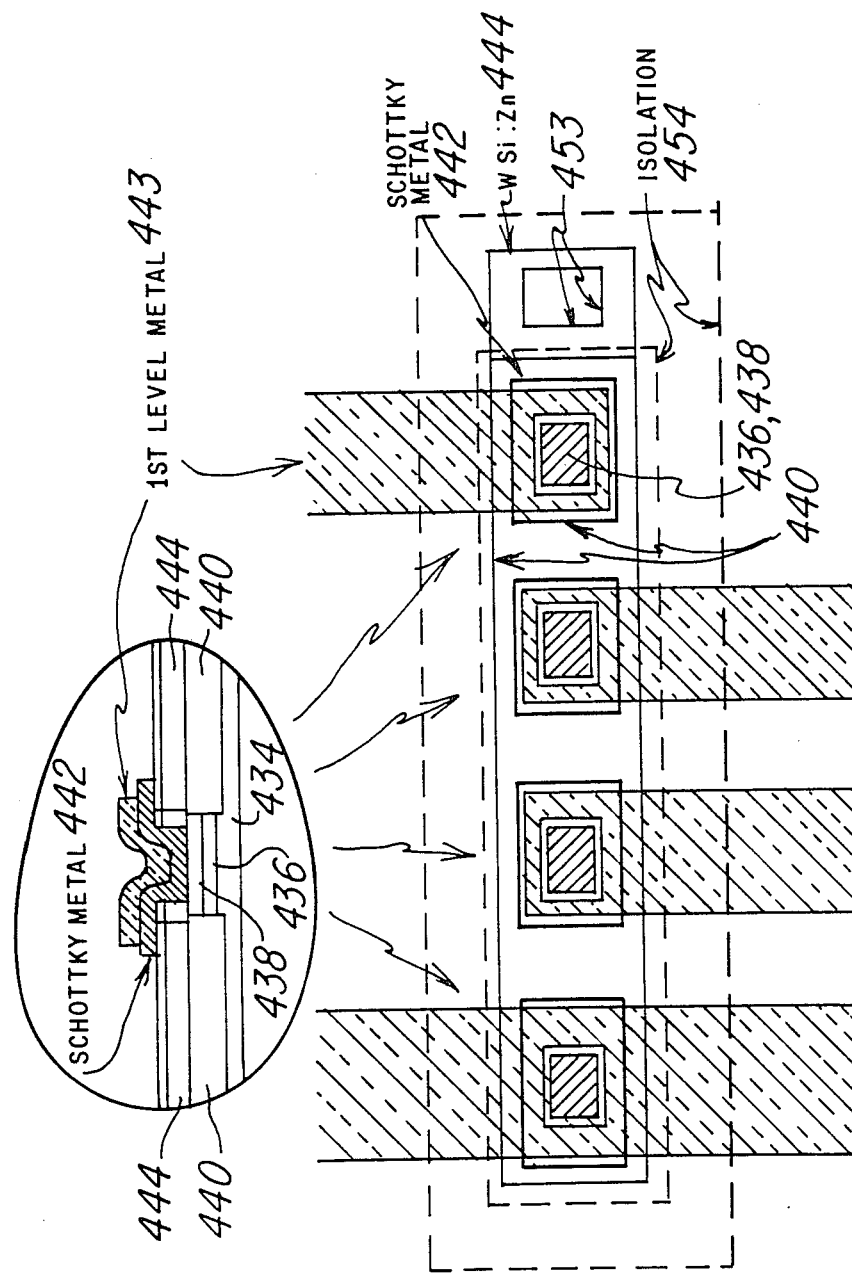
FIG. 10 illustrates in schematic plan view an integrated injection logic layout using devices of FIG. 8.

FIG. 10 is plan view of a heterojunction I²L layout incorporating a multiple collector device similar to device 330. In particular, the active area inside isolation 454 is about 30 microns by 5 microns and contains four collectors 438, each in an approximately 2 micron square hole in the common extrinsic p+ base 440 formed by zinc diffusion from zinc tungsten silicide base contact 444. Each collector 438 has an approximately 5 micron square contact 442 of titanium/platinum/gold forming a Schottky barrier diode and a first level metal titanium:tungsten/gold interconnect 443 on contact 442. Interconnect contact to base contact 444 may be made through opening 453 in oxide 452.

The insert in FIG. 10 gives a cross sectional view of each of the four collectors 438 with the corresponding intrinsic bases 436 and the common buried emitter 434 and common extrinsic base 440.

The preferred embodiment tungsten silicide diffusion source and method can be adjusted to better control the zinc diffusion. Generally, the WSi:Zn is a sputter deposited, solid source film that undergoes capless annealing in a quart-halogen lamp system. For a given time and temperature the diffusion of Zn into GaAs is controlled by both the Zn concentration and the W/Si ratio in the film. Tungsten-rich films are Zn concentration "independent" while Si-rich films are Zn concentration "dependent". Changing the film composition allows shallow Zn diffusions at either a low or a high temperature. Deep Zn diffusions are possible through higher temperatures or longer anneal times for any given WSi:Zn composition. These provide further preferred embodiment diffusion sources and methods.

The following tests were carried out for tungsten-rich and Si-rich films. The $W_xSi_y$:Zn was co-sputter deposited onto semi-insulating, undoped, LEC GaAs wafers. During the deposition, the wafers rested on a rotating table which sequentially passed under three separate targets composed of W, Si, and Zn. The table rotation was fast enough that the combined layer thickness of the W, Si, and Zn for one rotation was less than 10 Å. Therefore, the Zn was uniformly distributed throughout the 2,000 Å thick $W_xSi_y$:Zn film. After deposition the wafers were rapid thermal annealed in a quartz-halogen lamp system (HeatPulse 210 from A.G. Associates Inc.) for different time and temperature cycles in a forming gas (nitrogen plus 10% hydrogen) ambient. After annealing the $W_xSi_y$:Zn was stripped in fluorine-based plasma. The resultant Zn diffusion profiles were examined using step etching and sheet conductivity measurements. Hall measurements were performed for a selected number of samples.

The composition of the $W_xSi_y$:Zn films were originally based on the standardized $W_5Si_3$ sputter deposition which gives a film with a low compressive stress of about $5 \times 10^9$ dynes/cm$^2$, and gives a coefficient of thermal expansion similar to that of GaAs. The similar expansion coefficient reduces the stress of the $W_xSi_y$:Zn film during high temperature diffusion anneals which accounts for the 2,000 Å films' lack of cracking, good adherence, and uniform diffusion profiles. Because of the good film properties, there is no need for an encapsulating film on top of the $W_xSi_y$:Zn. Additionally, the GaAs surface should remain stable under the $W_xSi_y$:Zn film, because tungsten silicide is an effective barrier to GaAs surface decomposition during RTA for implant activation.

During initial characterization of the process, it was found that varying the W/Si ratio could expand the applicable temperature range more than could just modifying the Zn concentration of the film. With three independent sputter targets, a very large range of potential compositions exists that might have technological relevance. Therefore, two W/Si ratios were examined, a W-rich film and a Si-rich film, where each was doped at two Zn concentrations. During the actual sputter depositions, the Si sputter rate was fixed, while the W and the Zn were varied independently. Two $W_xSi_y$:Zn compositions were examined by Rutherford Backscattering to characterize both the W/Si ratio and the Zn doping concentration. The Si-rich film with the high Zn content had a W/Si ratio of 0.9, a Zn concentration of 10%, and a density of 12 g/cm$^3$. The W-rich film with the low Zn content had a W/Si ratio of 3.7, a Zn concentration of less than 5%, and a density of 19g/cm$^3$. The less than 5% arises from physical limitations during RBS where accurate Zn concentrations can only be made above 5% for the W-rich films. For convenience, the films will be referred to by W/Si-Zn%. In terms of density, both of these compositions are close to the 14.5g/cm$^3$ of $W_5Si_3$ which accounts for the films' good adherence and resistance to peeling during or after RTA. It was found that the Si-rich films, 0.9–<5% and 0.9–10%, tend to peel upon annealing at temperatures greater than 750° C., while W-rich films, 3.7–<5% and 3.7–10%, remain stable up to 950° C.

Zinc is found to diffuse across the $W_xSi_y$:Zn/GaAs interface in a source limited manner. This source limited diffusion occurs because both the Zn concentration in the tungsten silicide and the diffusion rate of the Zn out of the tungsten silicide can be individually controlled. Shallow diffusion profiles are possible at low temperatures, around 600° C., from Si-rich films and at high temperatures, around 800° C., from W-rich films. Tungsten-rich films are Zn concentration "independent," where the Zn concentration was found to have little, if any, affect on the diffusion profile in GaAs. Silicon-rich films are Zn concentration "dependent," so that the Zn diffusion profile is controlled at the GaAs surface by the Zn concentration in the $W_xSi_y$:Zn. These control extremes will be examined in the following discussion.

Figure 11:
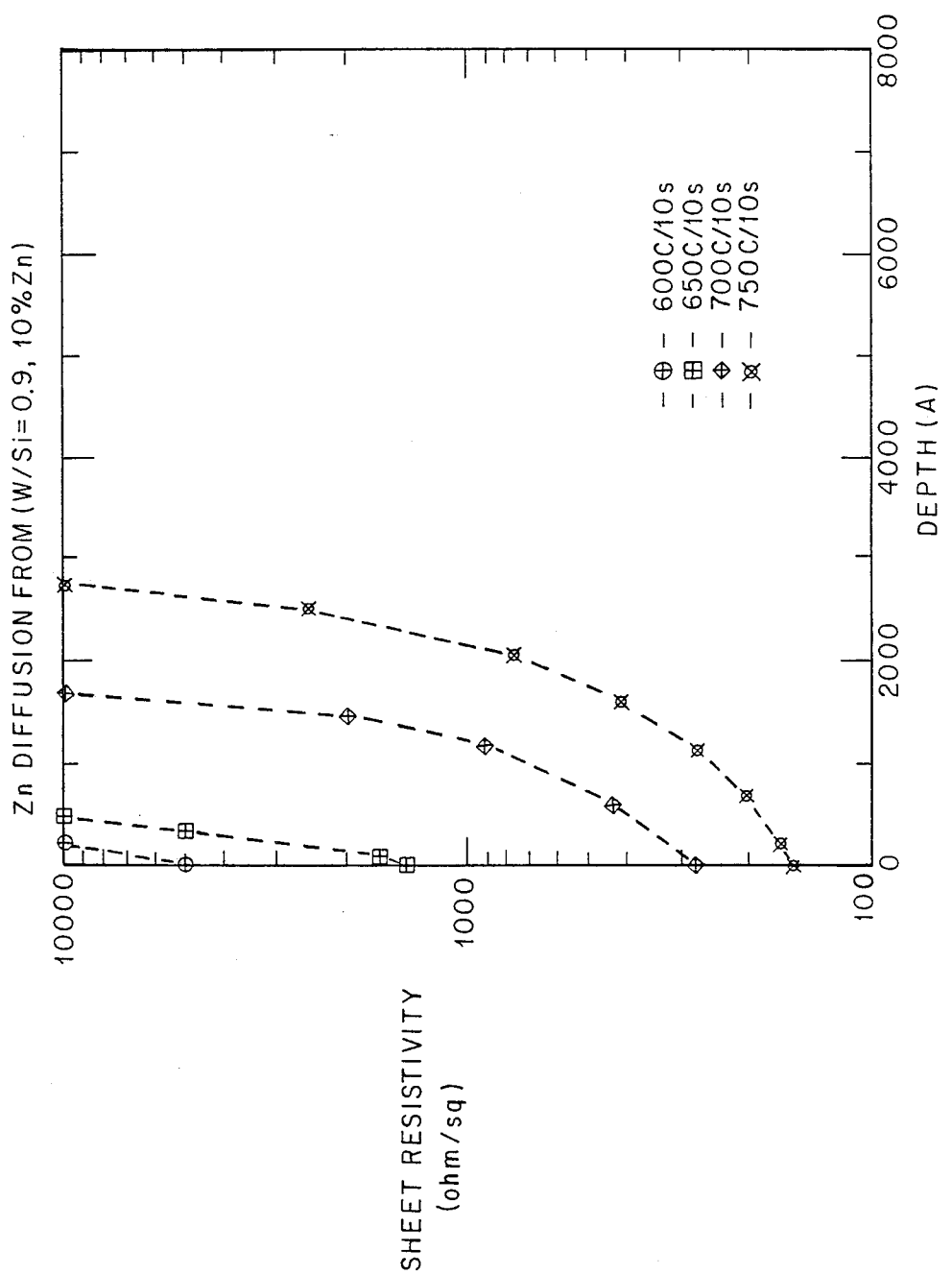
Figure 12:
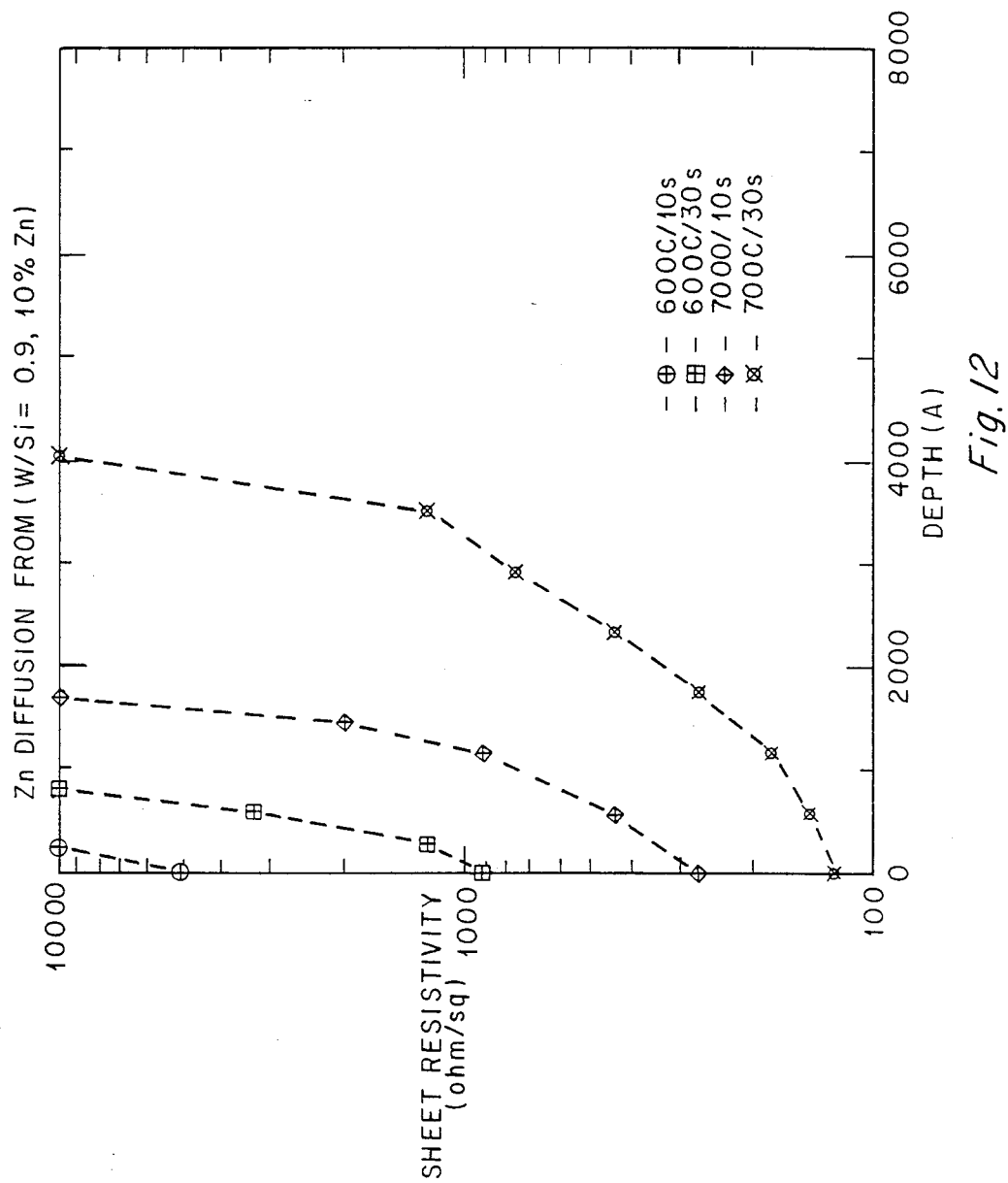
Figure 13:
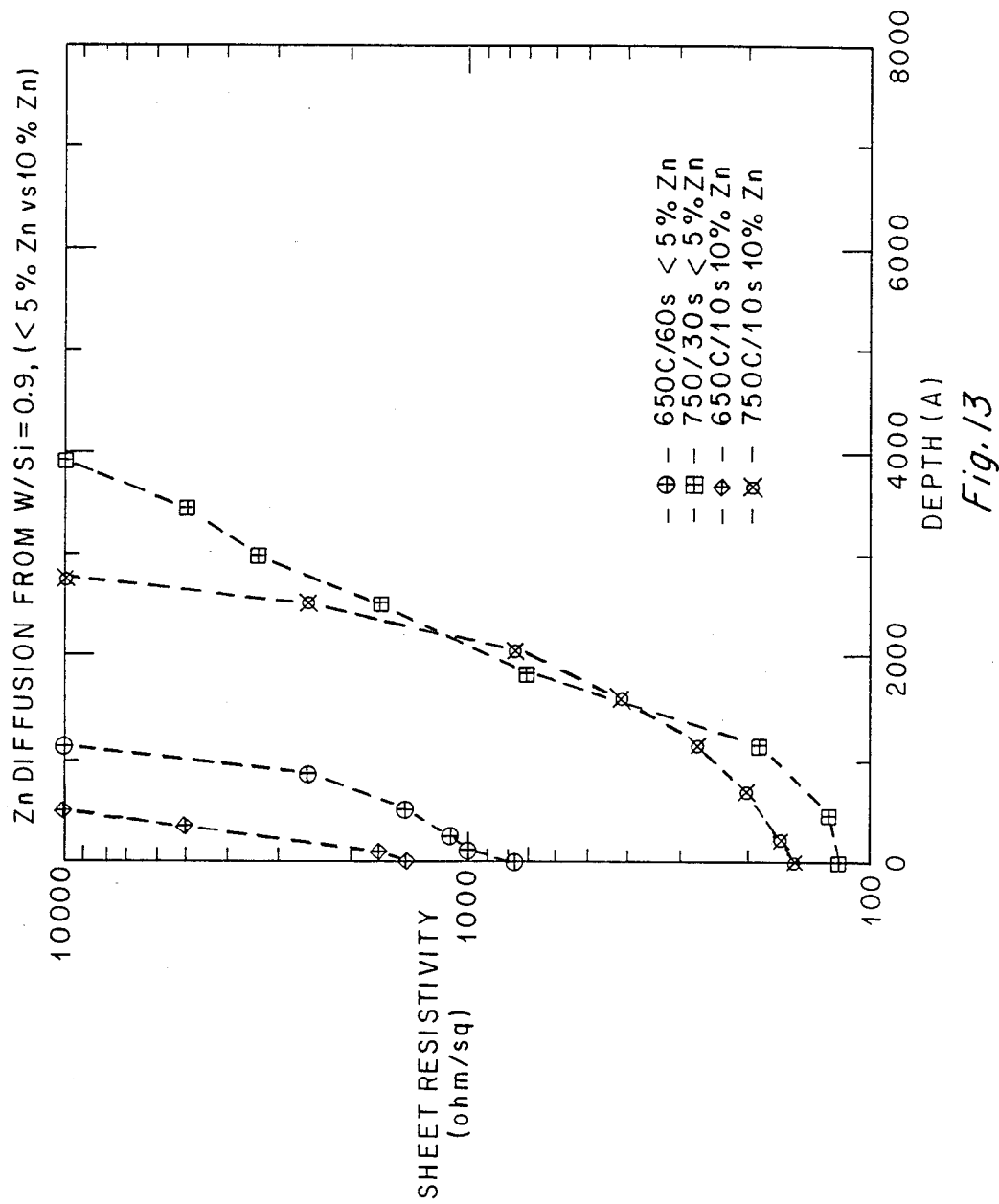

The 0.9–10% composition is intended for low temperature anneals or deep diffusion junction depths. FIGS. 11 and 12 illustrate the diffusion profiles from the 0.9–10% composition of $W_xSi_y$:Zn where sheet resistivity is plotted versus depth. FIG. 11 demonstrates the temperature dependence of the Zn diffusion profile where increasing temperatures give an increased junction depth. FIG. 12 shows two anneal times, 10 and 30 secs, for two different anneal temperatures, 600° and 700° C. This illustrates the well behaved diffusion of Zn into GaAs, with respect to time, for both shallow and deep diffusions. Hall measurements for both the 600° C./10 sec and the 700° C 10 sec anneal gave carrier concentrations of $9.8 \times 10^{18}$ and $5.6 \times 10^{18}$/cm$^3$ and gave mobilities of 86 and 85 cm$^2$/volt-sec, respectively. The 0.9–10% composition is similar to the Zn overpressure method in that it provides a high concentration of Zn at the surface of the GaAs. However, this method provides a shorter anneal time at the same 600° C. temperature for similar anneal depths (30 sec versus 100 sec for a 2,000 Å junction depth; see K. Shih, 123 J. Electochem. Soc. 1737 (1976)). Varying the Zn concentration of the the low W/Si ratio films directly controls the amount of Zn diffusing into the GaAs. FIG. 13 compares the 0.9–<5% and 0.9–10% films for similar junction depths at both 650° and 750° C. The 0.9–<5% film needs about a three times longer anneal to achieve the same depth that the 0.9–10% film does in 10 sec. The lower Zn content of the 0.9–<5% film results in a more shallow junction depth than the 0.9–10% film, which clearly shows the source limited nature of the diffusion process.

Figure 14:
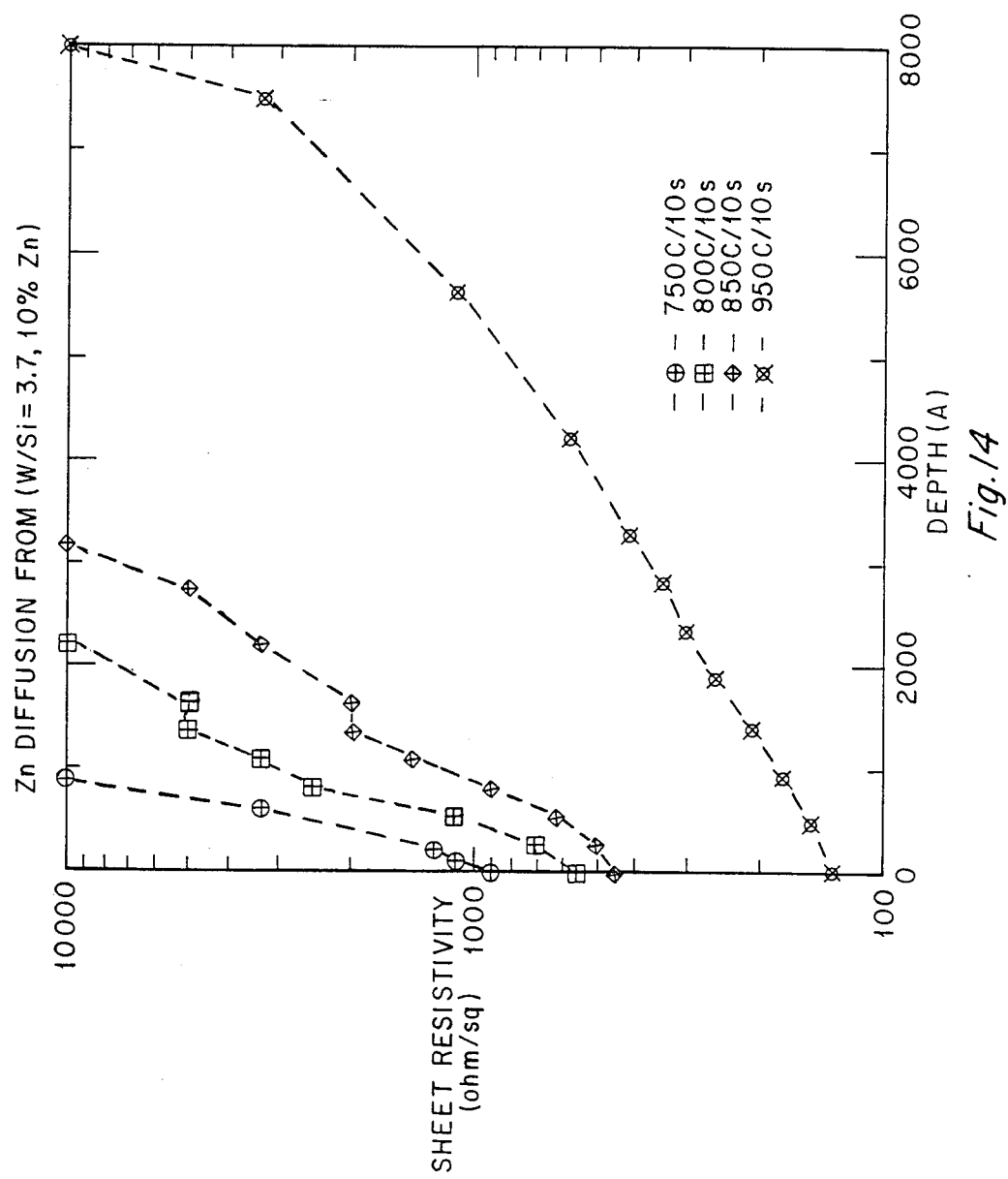
Figure 15:
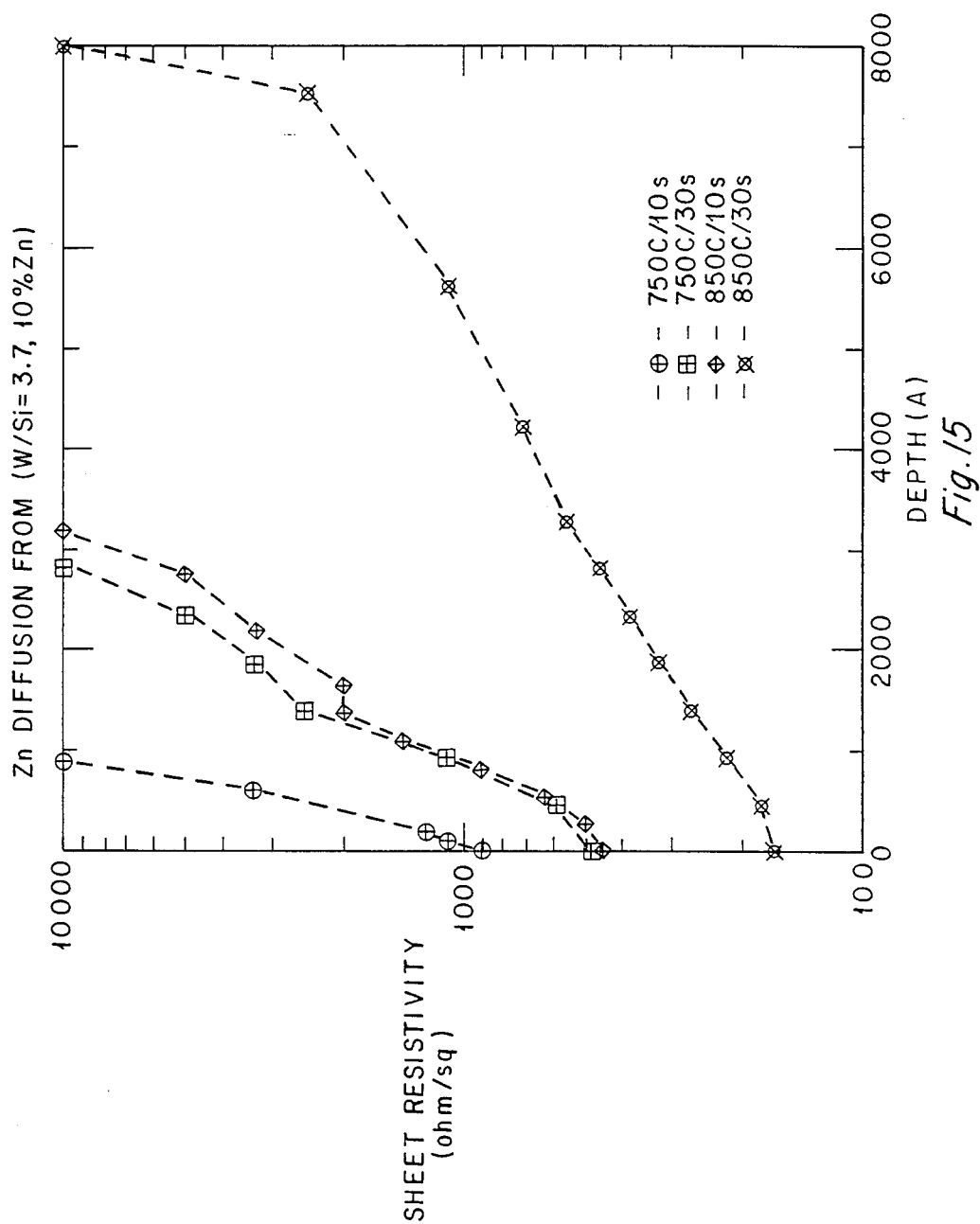
Figure 16:
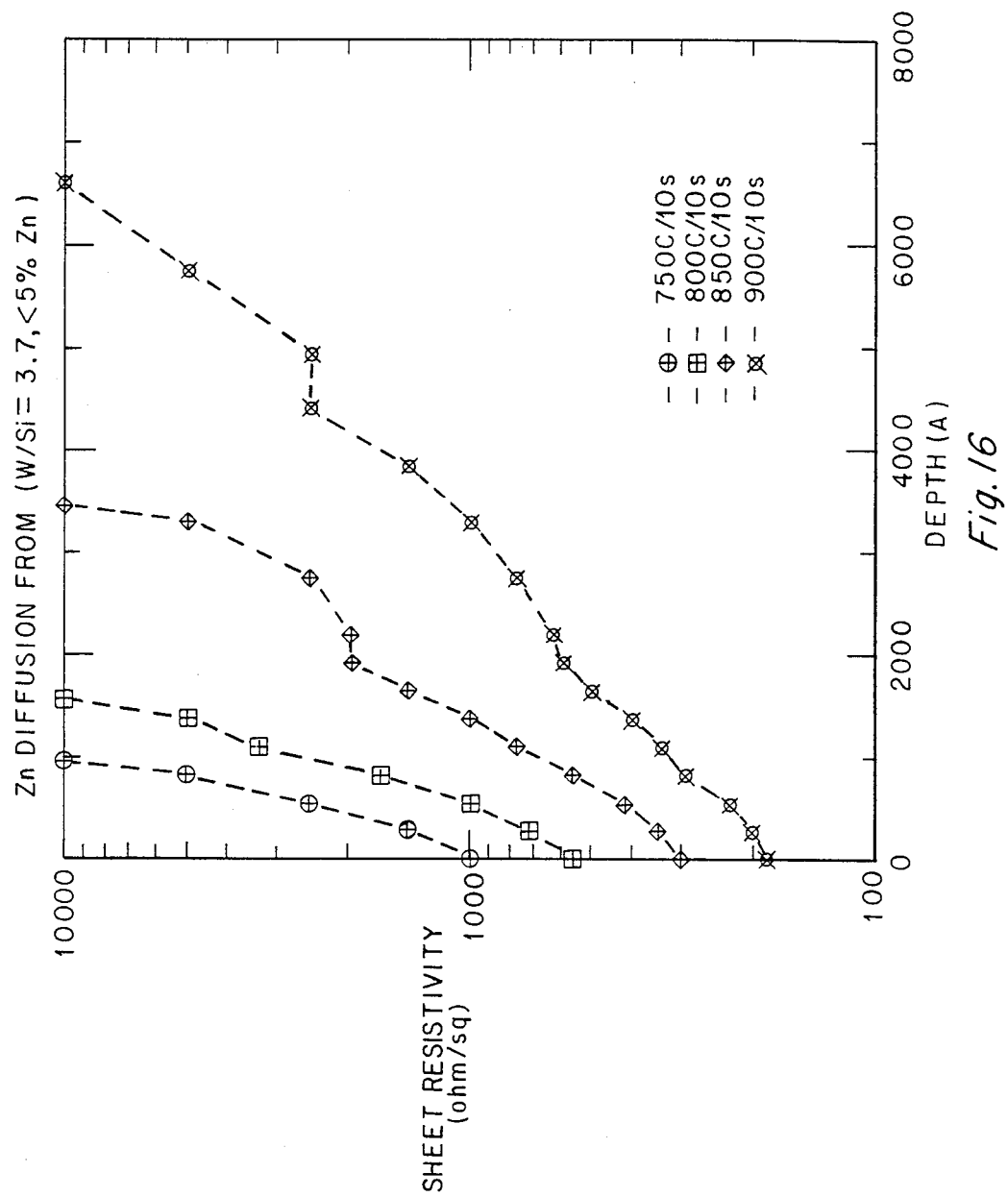
Figure 17:
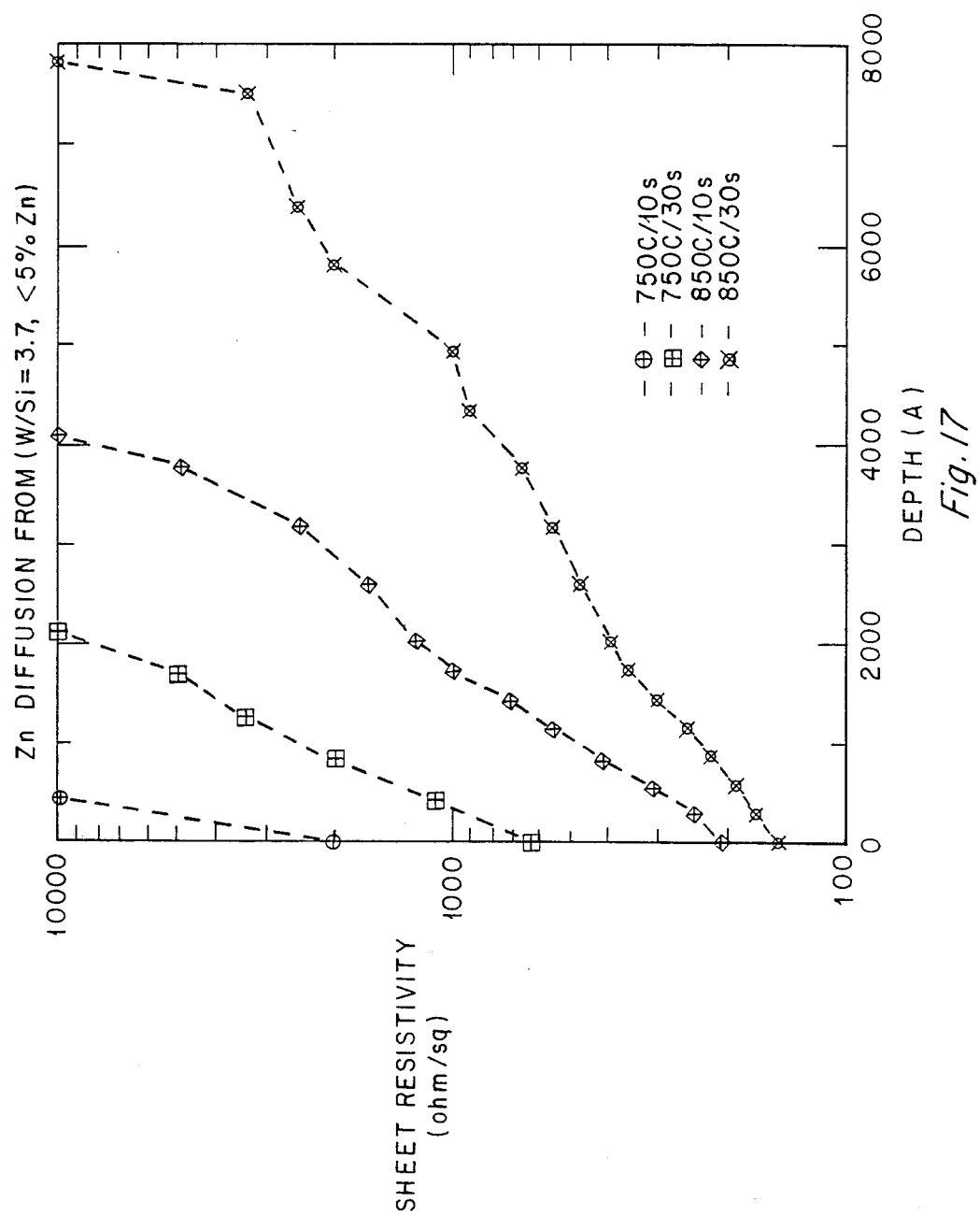

Shallow junctions at high temperatures, around 800° C., are maintained by changing to W-rich films, which reduces the Zn introduced into the GaAs. FIGS. 14 and 15 illustrate the diffusion profiles form the 3.7–10% composition of $W_xSi_y$:Zn. FIG. 14 shows a temperature scan of the 3.7–10% $W_xSi_y$:Zn from 750° to 950° C. FIG. 15 shows two anneal temperatures and two anneal times. The Zn profile shows reasonable increases in diffusion depth for the longer anneal times at both 750° and 850° C. Reducing the Zn content of the W-rich film by more than twice does not substantially alter the source behavior of the film. FIGS. 16 and 17 show the diffusion profiles from a 3.7-<5% film. FIG. 16 demonstrates that the Zn source is still well behaved with temperature, where the conductivity and the junction depth increase uniformly with temperature. FIG. 17 shows the reasonable increase in the diffusion profile with increasing anneal time. Hall measurements for both the 750° C./10 sec and the 850° C./10 sec anneal gave carrier concentrations of $4.1 \times 10^{18}$ and $8.2 \times 10^{18}/cm^3$ and gave mobilities of 145 and 97 $cm^2$/volt-sec, respectively. The Zn introduction into the GaAs must be limited in the film for two reasons. The high temperatures at which this W-rich film gives shallow profiles indicates that the diffusion in GaAs can not be the limiting factor. Second, the insensitivity of the diffusion profiles to the Zn concentration in the source film demonstrates that the limiting factor is in the Zn diffusion in the WSi or through the WSi/GaAs interface. At high temperatures, FIGS. 14-17, generally the diffusion profiles deeper than 1,000 Å exhibit a humped profile. This is characteristic of multiple diffusion processes. When Zn ampule diffusions are performed through a refractory film, at high temperatures (750°-900° C.), similar humped profiles are observed; see S. Tiwari, IEEE IEDM Tech.Dig. p.262, (1986). In leaky tube diffusions using longer anneal times and low temperatures (600° C.), again humped profiles are observed; see K. Shih, 123 J. Electochem. Soc. 1737 (1976). FIG. 18 shows that both W-rich and Si-rich films gave a junction depth that was linear with the square root of anneal time, indicating a predictable diffusion. Even with multiple diffusion mechanisms in the GaAs and a wide range of diffusion temperatures, both the W-rich and the Si-rich films gave well behaved diffusions.

Thus $W_xSi_y$:Zn diffusion source developed for rapid thermal annealing, which is capable of shallow diffusions from 600° to 950° C. Silicon-rich $W_xSi_y$:Zn films can be used as a low temperature (around 600° C.) Zn diffusion source. Tungsten-rich $W_xSi_y$:Zn films can be used as a high temperature (around 850° C.) Zn diffusion source.

MODIFICATIONS AND ADVANTAGES

Various modifications of the preferred embodiment devices and methods may be made while retaining the features of doping by diffusion from the metallic, high temperature contacts to permit threshold voltage adjustment by further diffusion, and sidewall self-alignment. For example, the dimensions and shapes of the various devices and component regions may be varied, and the doping levels may also be varied (as suggested in FIG. 6A the deep n+ of the source and drain are optional).

And beryllium may be used in place of zinc as the diffusing dopant, but beryllium requires a higher temperature for the diffusion. Other fast diffusers in gallium arsenide that could be used include magnesium, cadmium, and tin (an n type dopant); or combinations of any of these dopants. Other metallic silicides such as the silicides of molybdenum, tantalum, nickel and other elements from periodic table Groups IV A, V A, VI A, VII A, and VIII or combinations thereof may be used in place of tungsten silicide, but tradeoffs in other processing step characteristics will likely be necessary; for example, titanium silicide does not resist common oxide etch (HF based) as well as tungsten silicide does. And other materials such as indium phosphide and other III-V compounds may be used in place of the gallium arsenide/aluminum gallium arsenide.

The formation of the gate illustrated in FIG. 2B may be done by lift off rather than the plasma etching described. The dummy gate approach may be used in fabrication of device 330 rather than using the sidewall nitride. In particular, the collector may be defined by a PMMA patterning which removes all the PMMA except that over the collector (a "dummy collector"), then the zinc tungsten silicide is deposited and a short etch of the PMMA leaves the silicide on the PMMA overhanging. Oxide is deposited conformally, the PMMA dummy collector is removed, and the collector contact deposited.

Other device types may also use the features of the invention: such as diodes and MOS sources and drains.

We claim:
1. A method of fabrication of self-aligned doped-region/contact structures in a semiconductor device, comprising the steps of:
    (a) forming metallic silicide and dopants over the surface of semiconductor material comprising elements of periodic table Groups III and V; and
    (b) diffusing some of said dopants into said semiconductor material.
2. The method of claim 1, wherein: said metallic silicide comprises tungsten silicide; and
    said dopants comprise zinc.
3. The method of claim 1, wherein the step of diffusing dopants is performed by applying one or more thermal pulses to said dopants and said semiconductor material.
4. A method of fabrication of junction field effect transistors, comprising the steps of:
    (a) forming metallic silicide and dopants over the surface of a semiconductor channel region;
    (b) patterning said silicide and dopants to define a junction gate location;
    (c) diffusing some of said dopants into said channel region to form the junction gate; and
    (d) forming source and drain contacts adjacent the channel region.
5. The method of claim 4, wherein:
    (a) said channel region comprises gallium arsenide; and
    (b) said dopants comprise zinc.
6. The method of claim 5, further comprising the step of: adjusting transistor threshold voltage by applying one or more thermal pulses to said dopants and said channel region.
7. A method of fabrication of a bipolar transistor, comprising the steps of:
    (a) forming a substrate with layer doped for the emitter, base, and collector at least said base comprising elements from periodic table Groups III and V;
    (b) depositing and patterning, to define the active area plus extrinsic base, an insulating and diffusion barrier on the emitter layer;
    (c) depositing a metallic silicide and a dopant on said insulating and diffusion barrier;
    (d) depositing an insulator on said metallic silicide and said dopant;
    (e) patterning and etching said insulator and combination to define the active area;

(f) depositing a further insulating and diffusion barrier on said patterned insulator, exposed combination, and active area;

(g) heating said combination to diffuse some of said dopants into said layers to form the extrinsic base and define the emitter;

(h) anisotropically etching said further insulating and diffusion barrier to remove all of it except for sidewall portions on said exposed combination; and (i) depositing a contact for said emitter which is isolated from said combination by said sidewall portions and said insulator.

8. The method of claim 7, wherein said base comprises gallium arsenide.

9. The method of claim 7, wherein said emitter comprises aluminum, gallium and arsenic.

10. The method of claim 7, wherein said insulating and diffusion barrier comprises silicon nitride.

11. The method of claim 7, wherein:
(a) said metallic silicide is tungsten silicide;
(b) said dopant is zinc; and
(c) said insulator is silicon dioxide.

12. The method of claim 4 wherein said contacts include an alloy comprising gold and germanium with at least 20% germanium by weight.

13. The method of claim 4 wherein said metallic silicide comprises tungsten silicide.

14. The method of claim 1 wherein dopant diffusivity is a function of dopant concentration in said semiconductor material.

15. The method of claim 1 wherein said metallic silicide is characterized by a nonstoichiometric ratio of metal to silicon and dopant diffusivity is both a function of dopant concentration in said semiconductor material and the ratio of metal to silicon.

16. The method of claim 1 wherein said semiconductor material comprises gallium arsenide.

17. The method of claim 6 wherein thermal pulses are applied in the temperature range of 500° C. to 600° C.

* * * * *